United States Patent
Kolis et al.

(10) Patent No.: US 9,711,928 B2
(45) Date of Patent: Jul. 18, 2017

(54) SINGLE CRYSTALS WITH INTERNAL DOPING WITH LASER IONS PREPARED BY A HYDROTHERMAL METHOD

(71) Applicant: Clemson University, Clemson, SC (US)

(72) Inventors: Joseph Kolis, Central, SC (US); Colin McMillen, Liberty, SC (US)

(73) Assignee: Clemson University Research Foundation, Clemson, SC (US)

( * ) Notice: Subject to any disclaimer, the term of this patent is extended or adjusted under 35 U.S.C. 154(b) by 983 days.

(21) Appl. No.: 13/923,942

(22) Filed: Jun. 21, 2013

(65) Prior Publication Data
US 2013/0343715 A1    Dec. 26, 2013

Related U.S. Application Data

(60) Provisional application No. 61/663,077, filed on Jun. 22, 2012.

(51) Int. Cl.
| | | |
|---|---|---|
| *H01S 3/06* | (2006.01) | |
| *G02B 6/10* | (2006.01) | |
| *C30B 29/64* | (2006.01) | |
| *C30B 7/10* | (2006.01) | |
| *C30B 29/68* | (2006.01) | |
| *C30B 29/34* | (2006.01) | |
| *H01S 3/063* | (2006.01) | |

(Continued)

(52) U.S. Cl.
CPC .............. *H01S 3/0604* (2013.01); *C30B 7/10* (2013.01); *C30B 29/28* (2013.01); *C30B 29/34* (2013.01); *C30B 29/64* (2013.01); *C30B 29/68* (2013.01); *G02B 6/10* (2013.01); *G02B 6/131* (2013.01); *H01S 3/063* (2013.01); *Y10T 428/21* (2015.01)

(58) Field of Classification Search
None
See application file for complete search history.

(56) References Cited

U.S. PATENT DOCUMENTS

| 3,505,239 A | 4/1970 | Mazelsky et al. |
|---|---|---|
| 4,305,778 A | 12/1981 | Gier et al. |

(Continued)

FOREIGN PATENT DOCUMENTS

EP    0065382 A1    11/1982

OTHER PUBLICATIONS

Abstract for NSF award #0907395, http://www.nsf.gov/awardsearch/showAward?AWD_ID=0907395&HistoricalAwards=false, retrieved May 21, 2016.*

(Continued)

*Primary Examiner* — Mike Stahl
(74) *Attorney, Agent, or Firm* — Dority & Manning, P.A.

(57) ABSTRACT

Single heterogeneous crystals are described that contain multiple regimes, adjacent regimes varying from one another with regard to function. Also disclosed is a hydrothermal epitaxial growth process that can be utilized to form the single heterogeneous crystals. The single heterogeneous crystals can exhibit enhanced performance when used as a laser gain medium as compared to previously known single crystals and multi-crystal constructs. The heterogeneous single crystal can be utilized for thin disk lasers and can minimize the thermal distortion effects at high powers. The heterogeneous crystal can also serve as an embedded waveguide.

26 Claims, 4 Drawing Sheets

(51) Int. Cl.
G02B 6/13 (2006.01)
C30B 29/28 (2006.01)

(56) References Cited

U.S. PATENT DOCUMENTS

| | | | |
|---|---|---|---|
| 5,066,356 A | 11/1991 | Ferretti et al. | |
| 5,119,382 A | 6/1992 | Kennedy et al. | |
| 5,140,658 A * | 8/1992 | Sunshine | H01S 3/063 372/40 |
| 5,290,730 A * | 3/1994 | McFarlane | H01S 3/063 117/105 |
| 5,309,471 A * | 5/1994 | Chambaz | H01S 3/063 372/49.01 |
| 5,394,413 A | 2/1995 | Zayhowski | |
| 5,441,803 A | 8/1995 | Meissner | |
| 5,495,494 A | 2/1996 | Molva et al. | |
| 5,502,737 A | 3/1996 | Chartier et al. | |
| 5,563,899 A | 10/1996 | Meissner et al. | |
| 5,761,233 A | 6/1998 | Bruesselbach et al. | |
| 5,846,638 A | 12/1998 | Meissner | |
| 5,900,057 A * | 5/1999 | Buchal | H01S 3/0632 117/105 |
| 6,025,060 A | 2/2000 | Meissner | |
| 6,834,070 B2 | 12/2004 | Zapata | |
| 6,845,111 B2 | 1/2005 | Sumida et al. | |
| 6,944,196 B2 | 9/2005 | Wittrock | |
| 6,973,115 B1 | 12/2005 | Ferrand et al. | |
| 7,203,209 B2 | 4/2007 | Young et al. | |
| 7,211,234 B2 | 5/2007 | Kolis et al. | |
| 7,374,616 B2 | 5/2008 | Kolis | |
| 7,540,917 B2 | 6/2009 | Kolis et al. | |
| 7,563,320 B2 | 7/2009 | Kolis et al. | |
| 7,591,896 B2 | 9/2009 | Kolis et al. | |
| 7,731,795 B2 | 6/2010 | Kolis et al. | |
| 9,014,228 B1 * | 4/2015 | Kolis | H01S 3/1611 372/41 |
| 2003/0160034 A1 * | 8/2003 | Filgas | B23K 26/0648 219/121.68 |
| 2005/0200235 A1 | 9/2005 | Higuchi et al. | |
| 2005/0226303 A1 | 10/2005 | Suzudo et al. | |
| 2006/0233209 A1 * | 10/2006 | Kirilov | H01S 3/235 372/39 |
| 2007/0071059 A1 | 3/2007 | Afzal et al. | |
| 2007/0098024 A1 | 5/2007 | Mitchell | |
| 2007/0237483 A1 * | 10/2007 | Nashimoto | H01S 3/063 385/132 |
| 2007/0253453 A1 | 11/2007 | Essaian et al. | |
| 2009/0041067 A1 | 2/2009 | Meissner et al. | |
| 2010/0110536 A1 * | 5/2010 | Nashimoto | H01S 3/0632 359/341.5 |
| 2010/0189619 A1 | 7/2010 | Kolis et al. | |
| 2011/0100548 A1 * | 5/2011 | Shaw | B32B 18/00 156/308.2 |
| 2012/0045661 A1 * | 2/2012 | Kumaran | C09K 11/7758 428/690 |
| 2013/0344277 A1 * | 12/2013 | Kolis | H01S 3/0612 428/64.1 |
| 2015/0236470 A1 * | 8/2015 | Newburgh | H01S 3/0632 372/6 |

OTHER PUBLICATIONS

Armstrong et al., "Novel composite structure Nd:YAG gain media for high power scaling of side-pumped configurations", *Optics Communications*, (2000), 175, pp. 201-207.

Azrakantsyan et al., "Yb3+: YAG crystal growth with controlled doping distribution", Optical Materials Express, (2012), 2(1).

Degnan, "Optimization of Passively Q-Switched Lasers" *IEEE Journal of Quantum Electroic*, 31, 11, (1995) pp. 1890-1901.

Feldman et al., "Dynamics of chromium ion valence transformations in Cr, Ca:YAG crystals used as laser gain and passive Q-switching media", *Optical Materials*, 2003, 24, pp. 333-344.

Huang et al., "Nd: YVO4 single crystal fiber growth by the LHPG method", J of Crystal Growth 229 (2001) 184-187.

Kolb, et al., "Phase Equilibria of $Y_3 Al_5 O_{12}$, Hydrothermal Growth of $Gd_3 Ga_5 O_{12}$ and Hydrothermal Epitaxy of Magnetic Garnets" *Journal of Crystal Growth*, 29, (1975), pp. 29-39.

Mao et al., "High Efficient Laser Operation of the High-Doped Nd:YAG Crystal Grown by Temperature Gradient Technology", Chin.Phys.Lett. 19 (9), 2002, 1293-1295.

McDonald et al., "Reducing thermal lensing in diode-pumped laser rods", *Optics Communications*, (2000), 178, pp. 383-393.

Okhrimchuk, et al., "Performance of YAG:$Cr^{4+}$laser crystal" *Optical Materials*, 3, (1994) pp. 1-13.

Song et al., Growth of composite sapphire/Ti:sapphire by the hydrothermal method, *J. Crystal Growth*, 277, (2005), pp. 200-204.

Zayhowski, "Microchip Lasers", *Optical Materials*, 11 (1999) pp. 255-267.

Citation of Patent Applications—Related Applications Form.

Kolis et al., U.S. Appl. No. 12/832,108, filed Jul. 8, 2010, Heterogeneous Single Garnet Based Crystals for Passive Q-Switched Lasers and Microlasers and Method for Forming Same.

Kolis et al., U.S. Appl. No. 12/832,119, filed Jul. 8, 2010, Hydrothermal Growth of Heterogeneous Singe Crystals for Solid State Laser Applications.

Kolis et al., U.S. Appl. No. 12/832,115, filed Jul. 8, 2010, Heterogeneous Single Vandate Based Crystals for Q-Switched Lasers and Microlasers and Method for Forming Same.

Kolis et al., Applied for, filed Jun. 21, 2013, Hydrothermal Growth of Heterogeneous Single Crystals Exhibiting Amplified Spontaneous Emission Suppression.

* cited by examiner

SINGLE CRYSTALS WITH INTERNAL DOPING WITH LASER IONS PREPARED BY A HYDROTHERMAL METHOD

CROSS REFERENCE TO RELATED APPLICATION

This application claims filing benefit of U.S. Provisional Patent Application Ser. No. 61/663,077 having a filing date of Jun. 22, 2012, which is incorporated herein by reference.

STATEMENT REGARDING FEDERALLY SPONSORED RESEARCH OR DEVELOPMENT

This invention was made with government support under Grant No. FA9550-07-1-0566 awarded by the United States Air Force/Air Force Office of Scientific Research and under Grant No. 0907395 from the National Science Foundation. The government has certain rights in the invention.

BACKGROUND

Typically, a solid-state laser cavity contains a solid host material that is doped with a small amount of an activator ion collectively called the laser gain medium (LGM). This LGM can be pumped by a light source of suitable frequency. The light from the pump is absorbed by the activator ion in the LGM, creating a population inversion that causes stimulated emission of coherent light. The LGM is typically placed between two or more mirrors that internally reflect the pump light and create standing waves of coherent light. Such an arrangement is called a resonator cavity. The mirrors can be in the form of external self-standing objects with the LGM between them or dielectric coatings deposited directly on faces of the LGM crystal. The output light can be in the form of continuous or pulsed emission. Coherent laser light is generally understood to have photons all having the same wavelength with the same phase and propagating along the same vector.

The LGM in a solid-state laser is typically pumped with a flashlamp or diode pump. While the pumping process can be very efficient, particularly in the case of diode pumping, the process also puts considerable strain on the crystal because localized absorption also creates localized heating due to the quantum defect inherent in any laser pumping process. Quantum defects occur when the diode pump excites the lasing ions to a state that is higher in energy than the state from which they lase (the upper lasing state). The relaxation from initial excited state to the upper lasing state typically occurs by emission of energy in the form of heat. Such emission creates local heating that can be significant, especially for high power laser applications. Since the pump beam is so focused and localized, the corresponding heating will also be localized. Such localized heating is generally not desirable since it creates a number of negative effects such as thermal lensing and lattice expansion. Such effects can cause cracking of dielectric coatings and decreased quality of the lasing beam. In many cases the waste heat has been removed by contact with a heat sink, which can be located adjacent to the LGM.

While the gain medium can be the only crystal regime of a laser cavity, solid-state lasers often employ several other single crystal regimes that serve a series of purposes including thermal management, mechanical strength increase, waveguiding, Q-switching, harmonic generation and the like. These regimes can occur in the form of a series of separate and distinct single crystals, or alternatively, adjacent layers or films that have similar lattice structures and dimensions, but with slightly different chemical compositions where the different compositions reflect the different functions. For instance, LGM have been developed that have regions that vary from one another with regard to presence and/or amount of dopant ions. These LGM generally include individual pieces that contain gradient doping or contain individual layers within each piece that can serve the desired purpose.

One variation of solid-state lasers is the thin disk design. The thin disk design is particularly suitable for high power and high beam quality. In this case a crystal consists of thicker undoped substrate such as YAG, with approximate dimensions of 1 $cm^2$ area on a surface and 1 mm thickness. A second part of this LGM is a thin layer (perhaps 100-150 microns) of the same material doped with a suitable lasing ion such as $Yb^{3+}$. The layered LGM is mounted on a reflective heat sink. The crystal is pumped typically with a diode laser from the top and the reflective heat sink reflects the pump back up through the thin layer of lasing ions. A series of parabolic mirrors can repeatedly reflect the pump back down again through the disk making maximum use of the thin layer of dopant ions to generate high power (See, e.g., U.S. Pat. No. 6,577,666 to Steffen et al., and A. Giesen, et al. (IEEE Journal of Selected Topics in Quantum Electronics 13, 2007, 598-609)). The ability of the heat sink to remove excess heat minimizes the thermal defects that can occur at higher power operation such as thermal lensing and beam distortion. In addition, the thin layer of the lasing region minimizes the degree of strain and distortion that occurs in this region. These effects lead to high power and good beam quality. Alternatively an undoped end cap can also be introduced at the top of the crystal to minimize lattice deformation of the thin, doped layer and mitigate against damage of the necessary thin film dielectric coating and to prevent lower beam quality.

Another variation in solid-state laser design employs a waveguide LGM. These typically employ a thin film of host material doped with a laser active ion. This thin film is sandwiched between two other layers typically the same host which is undoped. The layers are chosen so the thin, doped layer has a higher index of refraction than the outer cladding layers creating a total internal reflectance condition. Waveguides have many applications related to laser operations. They have been prepared by a variety of methods. For example they have been prepared by layering several pieces including cladding layers and a lasing layer that have been polished to an optical finish and heating them to induce diffusion bonding as described in U.S. Pat. No. 7,217,585 to Sumida, et al.). In another approach a waveguide device has been grown using liquid phase epitaxy in which the layers are grown from a molten flux (see, e.g., U.S. Pat. No. 5,175,787 to Gualtieri, et al.; Ferrand, et al. (Optical Materials 11 (1999) 1010-114); and Pelenc, et al. (Optical Communications 115 (1995) 491-497)). In addition there have been described a large number of beam etching methods such as reactive ion beam and ion beam implantation to generate an optically active embedded layer in waveguide crystals (see, e.g., (Pollnau, et al. (Physique 8 (2007) 123-137)).

Unfortunately, LGM like thin disks and waveguides that include multiple regimes suffer from efficiency problems due at least in part due to the interface between the crystals forming the different regimes. One common method for forming LGM with multiple regions is to use thermal bonding methods to physically attach the separate pieces together. This is also commonly referred to as diffusion bonding and a number of descriptions exist that employ this technique in addition to the waveguide descriptions mentioned above (see, e.g., Griebner, et al. (Optics Communications 1999, 164, 185-190), or U.S. Pat. Nos. 5,846,638 to Meissner, 5,441,803 to Meissner, 6,160,824 to Meissner, et al. and 7,217,585 to Sumida et al.). Similarly, the various layers of a thin disk laser are typically attached by the diffusion bonding method (see, e.g., U.S. Pat. No. 6,347,109 to Beach et al. and U.S. Pat. No. 8,165,182 to Geisen et al.). In this method, separate pieces are polished to an extremely high level of flatness and smoothness and heated to 50-90% of their melting points under pressure. The pieces are then fused together at the polished interface. The ability to fuse different types of pieces together enables the formation of gradient doping as well as waveguide devices.

An alternative method used to prepare LGM pieces with different regimes has been to grow the layers individually on appropriate substrates using the liquid phase epitaxy (LPE) method. In this case a suitable feedstock is dissolved in a high temperature melt (usually of a molten salt) and the substrate is dipped into the melt. If the solution is supersaturated then layers of the desired material can be grown on the substrate. (see, e.g., J. Hulliger, et al. (Laser Physics 1998, 8, 764-768), U.S. Pat. No. 4,810,325 to Licht, Most of such disclosure has related to semiconductors or magnetic materials but some have disclosed formation of waveguides through LPE (see, e.g., U.S. Pat. No. 4,116,530 to Bellevance, et al. U.S. Pat. No. 5,175,787 to Gualtieri U.S. Pat. No. 4,766,954 to Bierlien et al. and U.S. Pat. No. 5,150,447 to Tamada et al.)). The appropriate mixing and matching of layers grown by LPE can lead to a wide variety of potential devices that employ waveguides and gradient doping (see, e.g., Ferrand, et al. (Optical Materials 1999, 11 101-114)). Unfortunately, such methods have failed to alleviate problems associated with a multiple regime crystal for use in lasing operations.

Hydrothermal epitaxial growth has been described previously for some oxides, particularly for incipient ferroelectrics (see, e.g., Hayashi, at al. (Mater. Sci. 2008, 43, 2342-2347) and Gleichman, et al, (Crystal Research Technology 2001, 36, 1181-1188)) and bubble memory garnets (especially $Y_3Fe_5O_{12}$, YIG) (see, e.g., Ferrand, et al. (Mat. Res. Bull 1974, 9, 495-506) and Kolb, et al. (J. Crystal Growth 1975, 29, 29-39)). Hydrothermal processes have also been utilized to prepare single crystals that can be utilized in a variety of laser application (see, e.g., U.S. Pat. Nos. 7,563,320; 7,540,917; and 7,211,234 to Kolis, et al.).

What is needed in the art are methods for formation of LGM-based devices such as solid state lasers, including thin disk lasers, waveguides, and the like that can incorporate multiple regimes in a single crystal and thus avoid problems such as thermal distortion and coatings damage. Moreover, a method based upon hydrothermal epitaxial growth could present a variety of benefits to the art.

SUMMARY

According to one embodiment, a heterogeneous monolithic thin disk laser crystal is disclosed. For instance, the monolithic thin disk laser crystal can include a first layer, a second layer, and a third layer, with the second layer being between the first and third layers. The first layer includes an undoped host material, the second layer includes the host material and a lasing ion dopant, and the third layer includes the undoped host material. The heterogeneous monolithic thin disk laser crystal can have a face having a diameter of about 1 centimeter or larger, and the thickness of the active second layer can be between about 30 micrometers and about 150 micrometers.

According to another embodiment, disclosed is a monolithic single crystal waveguide. The monolithic single crystal waveguide can include a first layer, a second layer and a third layer, with the second layer between the first and third layer. The first layer can include a host material, the second layer can include the host material and a lasing ion dopant, and the third layer can include the undoped host material. In addition, the refractive index of the second layer is different than the refractive index of the first layer and the third layer. The monolithic single crystal waveguide can have a length of about 2 centimeters or longer.

Also disclosed are methods for forming the monolithic crystal waveguides and thin disk crystals. For instance, a method can include heating and pressurizing an aqueous solution held within a reactor to develop a temperature differential between a first zone of the reactor and a second zone of the reactor, the reactor containing a feedstock in the first zone and a seed crystal in the second zone, the seed crystal including the host material, the feedstock including a source for forming the host material and a source for the lasing ion dopant, wherein upon said heating and pressurizing growth of the second layer is initiated on the seed crystal to form an intermediate crystal including the second layer and the seed crystal as the first layer of the waveguide or the thin disk crystal.

The method can also include heating and pressurizing a second aqueous solution held within a second reactor to develop a temperature differential between a first zone of the second reactor and a second zone of the second reactor, the second reactor containing a second feedstock in the first zone and the intermediate crystal in the second zone, the feedstock including a source for forming the host material, wherein upon said heating and pressurizing growth of the third layer is initiated on the intermediate crystal. The monolithic single crystal waveguide or the monolithic thin disk laser crystal can include the first, second and third layers.

BRIEF DESCRIPTION OF THE FIGURES

A full and enabling disclosure of the present subject matter, including the best mode thereof to one of ordinary skill in the art, is set forth more particularly in the remainder of the specification, including reference to the accompanying figures in which:

FIG. 6 illustrates the multi-regime crystal of FIG. 5 showing the original concentration gradient (FIG. 6A) and the concentration gradient of the crystal following a dopant diffusion process (FIG. 6B) encouraged by heating of the as-formed crystal.

DETAILED DESCRIPTION

Reference will now be made in detail to various embodiments of the disclosed subject matter, one or more examples of which are set forth below. Each embodiment is provided by way of explanation of the subject matter, not limitation thereof. In fact, it will be apparent to those skilled in the art that various modifications and variations may be made in the present disclosure without departing from the scope or spirit of the subject matter. For instance, features illustrated or described as part of one embodiment, may be used in another embodiment to yield a still further embodiment.

In general, the present disclosure is directed to single heterogeneous crystals that can contain multiple regimes within the crystals, adjacent regimes varying from one another with regard to function. Also disclosed is a facile formation process that can be utilized to form the single heterogeneous crystals that can economically improve laser performance in a wide variety of designs and devices. More specifically, disclosed are single heterogeneous crystals containing multiple regimes, wherein adjacent regimes can vary from one another according to concentration and/or presence of a dopant. The single heterogeneous crystals can exhibit enhanced performance for instance when used as an LGM as compared to previously known single crystals and multi-crystal constructs utilized in a similar fashion. In one embodiment the heterogeneous single crystal can contain gradient doping of lasing ions within the crystal. Such an arrangement is particularly suitable for thin disk lasers, for instance to minimize the thermal distortion effects at high powers. In another embodiment, the heterogeneous crystal can include an epitaxial layer doped with laser active ions, the epitaxial layer having an increased refractive index. This crystal can serve, for example, as an embedded waveguide. Both of these arrangements can result in a laser that can have improved power and efficiency.

The heterogeneous crystal can include multiple regions within the single crystal, adjacent regions containing varying concentration and/or presence of metals ions, and in particular varying concentration and/or presence of metal ions that can function as lasing ions, so as to form multiple regimes within the crystal. As utilized herein the term 'regime' generally refers to an area of a crystal that exhibits particular optical characteristics. Thus, adjacent regions of a crystal that differ from one another according to, e.g., photon absorption characteristics, excitation wavelength transparency, etc., can be considered to be different regimes. In one embodiment, the metal ions in adjacent regions can be the same as one another, such that the crystal can have a concentration gradient of the metal ion across the crystal. A concentration gradient of lasing ions across the crystal can serve to even out the absorption of the pump beam, with the result that the laser can exhibit reduced thermal damage and/or beam distortion.

Figure 1:
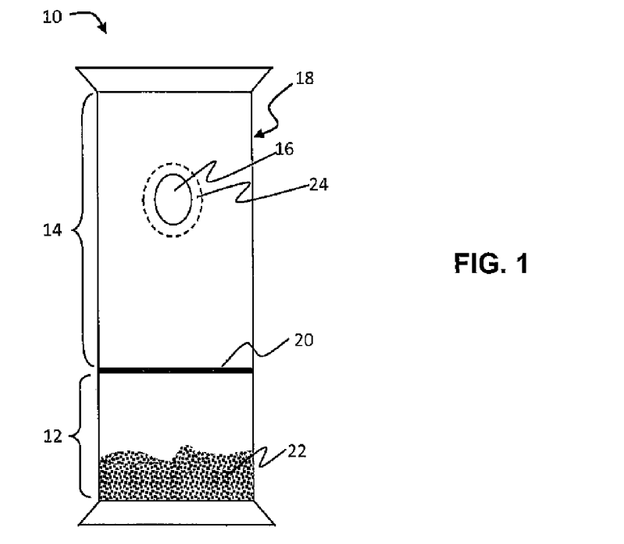
FIG. 1 is a schematic diagram of one embodiment of a hydrothermal growth system as described herein.

A hydrothermal epitaxial growth formation process can be used to produce the different regimes of the heterogeneous crystals. FIG. 1 illustrates one embodiment of a hydrothermal system 10 as may be utilized in a process. In general, a hydrothermal process involves the use of a superheated aqueous solution (liquid heated above its boiling point) under pressure to cause transport of soluble species of, e.g., a refractory oxide, from a nutrient rich zone 12 to a supersaturated zone 14. As the species is not sufficiently soluble in the superheated water, the species will crystallize, either spontaneously according to primary nucleation or alternatively on a seed crystal 16 located in the supersaturated zone 14.

The hydrothermal process can take place within a reactor 18. Depending on the chemical demands of the specific system, a reactor 18 can be lined with a noble metal such as silver, gold, platinum, palladium, etc. For instance, a liner can be a fixed liner or a floating liner. A fixed liner reactor can be in the form of a stand-alone autoclave that is lined with or formed of a desired material and can carry the reactants, products, etc. When utilizing a floating liner, a smaller structure that is lined with or formed of the desired material and containing the reactants can be held or suspended within a larger autoclave. Materials for formation of a reactor are generally known in the art and include, without limitation, metals, quartz, ceramics, Teflon®, and so forth.

A reactor 18 is generally sealable, as with a cold seal, and can be of any desirable size depending, for example, on whether a process utilizes a fixed or floating liner, the size of product crystal to be formed by the process, energy requirements (e.g., temperatures and temperature gradient during a process), and so forth. For instance, a stand-alone autoclave reactor with either fixed liner or unlined can generally be between about 1 cm and about 10 cm in a cross sectional dimension and between about 10 cm and about 100 cm in height. A floating liner reactor can generally be smaller, for instance between about 0.25 cm and about 2 cm in diameter and between about 2.5 cm and about 10 cm in height. Of course, larger and smaller reactors are also encompassed herein.

A reactor 18 can include a baffle 20 between a nutrient rich zone 12 and a supersaturated zone 14. A baffle 20 can be formed of the same or different material as the inner wall of the reactor 18. For instance, when considering a silver-lined or silver floating reactor 18, baffle 20 can also be silver or silver lined. Baffle 20 can define at least one hole for passage of solution from the nutrient rich zone 14 to the supersaturated zone 20. A baffle 20 can aid in maintaining a temperature differential between the two zones and can encourage substantially isothermal characteristics in each zone. Baffle 20 can also restrict convective flow between nutrient rich zone 14 and supersaturated zone 20 and can channel the convective flow across the baffle 20 into a desirable geometry.

System 10 can also include heaters, insulators, controllers, etc. as are generally known in the art (not shown on FIG. 1). For example, controllers can be utilized for changing the power delivered to heaters, which can determine the thermodynamic condition of the autoclave. Additionally, though illustrated in a vertical arrangement with the nutrient rich zone 12 below the supersaturated zone 14, this is not a requirement of the formation process, and the two zones can be located in any suitable relationship to one another, for instance in a horizontal or any other angled relationship, as long as a temperature differential between the two zones can encourage convective flow there between.

The seed crystal 16 can be formed or placed in the growth zone 14 to facilitate crystallization of a dissolved feedstock 22 from a supersaturated solution. The seed crystal 16 can include a host material. While not a requirement of the process or the heterogeneous crystals formed thereby, in general the host material of the seed crystal 16 can be present throughout the entire formed heterogeneous crystal. Through utilization of a common host material throughout the heterogeneous crystal, lattice matching between adjacent regions can be simplified.

The host material can be any crystalline material that can be grown hydrothermally. In one particular embodiment, the host material can be an oxide suitable for use in a lasing methodology. One exemplary host material is $Y_3Al_5O_{12}$ (YAG), which is commonly utilized in laser technologies. Though the present discussion often refers to a YAG host material, it should be understood that the disclosure is in no way limited to YAG host materials. Methods can be extended to many other hosts as well. By way of example, hosts such as $YVO_4$ and $M_2O_3$ (where M is Sc, Y or Lu) can be utilized. Numerous other host lattices including garnets such as $Lu_3Al_5O_{12}$ (LuAG), $Gd_3Ga_5O_{12}$, $Gd_3Sc_2Ga_3O_{12}$ (GSGG); oxides; spinels; perovskites; phosphates; vanadates such as $YVO_4$, $GdVO_4$, $LuVO_4$, and others, examples of which are described in U.S. Pat. No. 7,211,234 to Kolis, et al. (incorporated by reference); borates; rare earth sesquioxides such as $Sc_2O_3$, $Y_2O_3$, $Lu_2O_3$ and others, examples of which are described in U.S. Pat. No. 7,563,320 to Kolis, et al. ( incorporated herein by reference); fluorides and other halides; etc. are encompassed, and host materials are only limited by their stability in hydrothermal fluids, as further described below.

Lanthanide sesquioxides having the general structure of $M_2O_3$, where M can be various combinations of the lanthanide metals such as Y, Gd, Sc and Lu (as described in U.S. Pat. No. 7,563,320) can be utilized as host materials. The sesquioxides are attractive as host materials for high power thin disk applications because of their relatively large thermal conductivity, which can allow for efficient removal of heat by a heat sink. In one embodiment, $Lu_2O_3$ as a host oxide can have a number of inherent advantages in thin disk lasers (see, e.g., Peters et al "Broadly Tunable High Power Yb:$Lu_2O_3$ Thin Disk Laser with 80% Slope Efficiency" Optics Express 2007, 15, 7075-7082.). For instance, the ability to grow well constructed multifunctional layers (end caps, gradient doping) such as Yb doped $Lu_2O_3$ by the hydrothermal process can impart a number of advantages to thin disk laser design.

For higher power applications lutetium based hosts, such as $Lu_3Al_5O_{12}$ and $Lu_2O_3$, are attractive because Lu has very similar mass to that of the laser on dopants such as Yb, which is a common high power laser ion. The nearly identical mass of Yb and Lu means that the thermal conductivity of the doped crystal will not decrease substantially relative to that of the pure material (See Aggarwal et al J. Applied Physics 2005, 98, 103514 and Brown et al. Laser Technology for Defense and Security VIII SPIE Proceedings 8381-7 2012). Host materials in which the host material ions have a substantially different mass from the dopant, such as Y vs. Yb in Yb:YAG, can suffer from a significant decrease in thermal conductivity relative to the parent host. This can inhibit thermal transfer to a heat sink, decreasing beam quality during high power operations.

Also encompassed are host materials that contain mixed metal ions including but not restricted to $Y_xLu_yAl_5O_{12}$. A mixed ion host material can be doped with various concentrations of lasing ions such as Nd:$Y_xLu_yAl_5O_{12}$ or Yb:$Y_xLu_yAl_5O_{12}$. (x=0-2.99 and y=3-x). The use of a mixed metal host material can provide several advantages in that it can be used to match the lattice size of adjacent regions to reduce strain upon pumping and also to vary the refractive index. It can also have the additional advantage that it can broaden the absorption peaks that serve as the pump band. Typically this includes the peak near 808 nm for $Nd^{3+}$ and 970 nm for $Yb^{3+}$. Both peaks are fairly sharp and a diode laser pump beam can vary its wavelength and shift away from that band. Thus a mixed ion host material can broaden the absorption peak and minimize the performance loss caused by shifting the pump line. It can be especially desirable to enhance the pump line at 970 for Yb since that reduces the quantum defect and resultant waste heat in the lasing process. Since Yb is often the laser ion of choice in high power applications and excess thermal strain is a major cause of failure, the ability to pump the absorption peak near 970 efficiently is a significant improvement in high power applications.

The seed crystal 16 can be formed of the pure host material or can include as dopant an active lasing ion as is known in the art. By way of example, the seed crystal 16 can include as dopant an active ion such as, but not restricted to, $Nd^{3+}$, $Nb^{3+}$, $Yb^{3+}$, $Er^{3+}$, $Ho^{3+}$, or $Tm^{3+}$. A variety of other suitable lasing ions known to practitioners can be doped into the seed crystal as well. An active lasing ion dopant can be included in a seed crystal in an amount according to standard practice, for instance in an amount of from about 0.2 atomic (at.) % to about 10 at. %.

The seed crystal 16 can also be a multifunctional material. For example, the seed crystal 16 can be doped with multiple dopants, each of which can provide a different function to the product heterogeneous crystal. By way of example, the seed crystal 16 can be doped with $Nd^{3+}$ or $Yb^{3+}$ as well as $Ca^{2+}$ and $Cr^{4+}$. In this embodiment, the $Cr^{4+}$ can serve as a saturable absorbing Q-switch in a co-doped LGM. Such materials have been described previously (see, e.g., S. Zhou, K. K. Lee, Y. C. Chen, S. Li Optics Letters 1993, 18, 511.).

A seed crystal 16 may be obtained according to any formation process as is generally known. For instance, a seed crystal 16 can be formed according to a hydrothermal method under transport parameters as previously described (see, e.g., U.S. Pat. Nos. 7,563,320, 7,540,917, and 7,211,234 to Kolis, et al., incorporated herein by reference). A seed crystal can be grown from a melt according to a liquid phase epitaxy process or according to a vapor deposition process, or alternatively cut from a larger crystal formed according to such a process. Some seed crystals such as YAG and $YVO_4$ materials can be produced by any of the standard growth methods known to practitioners of the art, including melt growth, flux growth, Czochralski pulling, top seeded solution growth, heat exchanger and similar methods.

The seed crystal 16 can also of any suitable size, which is generally limited only according to the diameter of the reactor 10. For instance, a seed crystal can be about 1 mm in thickness, and about 1 cm in diameter, or larger, as desired. For example, a seed crystal can have a cross sectional dimension of up to several millimeters, for instance between about 50 micrometers and about 10 millimeters, between about 100 micrometers and about 5 millimeters, or between about 250 micrometers and about 2 millimeters.

Hydrothermal conditions can be established in the reactor 18 for growth of an epitaxial layer 24 on the seed crystal 16. For instance, in aqueous fluids at temperatures between about 400° C. and about 600° C.; the aqueous fluid containing various simple anions such as $OH^-$, $CO_3^{2-}$, $F^-$ or $Cl^-$ in concentrations ranging between 0.1M and 20M, the metal oxide systems described above can grow as high quality crystal layer on the seed crystal 16.

Feedstock 22 can be located in the nutrient rich zone 12 and can include in a powdered form the host material or sources for forming the host material. As mentioned, while the host material of an individual layer can be the same as the host material of an immediately adjacent layer can generally be the same, this is not a requirement, and the host material can differ between layers. However, the lattice of adjacent layers should be the same or highly similar in order to form a single heterogeneous crystal following the hydrothermal growth process. The feedstock 22 can also include a source for one or more dopants for use as lasing ions (including but not limited to Nd, Yb, Er, Ho, Tm and other metal ions that display lasing properties). For example, feedstock 22 can include a powder or microcrystalline sample of the target material for the layer 24, such as $Yb_xY_{1-x}Al_5O_{12}$, $Yb_xLu_{1-x}Al_5O_{12}$ or the similar garnets, or $Yb_xLu_{2-x}O_3$ or $Nd_xY_{1-x}VO_4$ as non-limiting examples. Alternatively the feedstock 22 can include starting materials such as $Y_2O_3$, excess $Al_2O_3$, and a suitable amount of $Yb_2O_3$ to grow a Yb doped YAG layer 24. The dopant ion concentration within the layer 24 can be controlled by the amount of dopant in the feedstock 22. A seed crystal 16 can be employed as the substrate and is suspended in the growth zone 14 of the reactor 18.

The dopant ions can be varied over a wide range including all of the lanthanide ions from La—Lu as well as various other transition metals particularly but not limited to trivalent ions such as $Cr^{3+}$, $Ti^{3+}$, $Co^{3+}$ and similar ions, ions with other valences can be included in the feedstock as well along with appropriate other substitutions to balance charge. Thus for example, $Cr^{4+}$ can be substituted along with $Ca^{2+}$ in a garnet hosts material, and also $Co^{2+}$ can be substituted along with corresponding St to balance the trivalent charges of the Y and Al that are substituted in YAG.

The aqueous solution used in the hydrothermal process can include a mineralizer that can facilitate dissolution and transport of the feedstock. The nature and concentration of the mineralizer varies from system to system and can alter the crystal growth rate and quality. A mineralizer can include one or more small ionic species and can be added to the hydrothermal solution. Ions include but are not limited to $OH^-$, $CO_3^{2-}$, $F^-$, $Cl^-$, $NO_3^-$ and $H^+$ in various concentrations. Control of identity and concentration of a mineralizer can facilitate both the rate and quality of crystal growth. Mineralizers and parameters for their use are well known to those practiced in the art and have been used for the growth multiple electro-optic crystals such as KTP (see, e.g., U.S. Pat. No. 4,305,778 to Gier and U.S. Pat. No. 5,066,356 to Ferretti, et al., both of which are incorporated herein by reference).

The concentration of a mineralizer used in a process can vary, as is known in the art. In general, mineralizer concentration can be greater than about 1 M, for instance mineralizer concentration can vary between about 1M and about 30M, or even higher in some embodiments. In the case of a YAG base material, carbonate mineralizer can be used, for instance in a concentration between about 2M and about 5M. A process including a feedstock mixture of $Yb_2O_3$ and $Lu_2O_3$ can utilize a hydroxide mineralizer, for instance in a concentration between about 10M and about 30M. In another example, doped $YVO_4$-based material can be grown employing a hydroxide mineralizer at a concentration of between about 1M and about 2M.

During the hydrothermal crystal growth process, a superheated hydrothermal fluid can be contained in the reactor 18 under pressure, typically between about 5 kpsi and about 30 kpsi. Growth and supersaturation control is achieved by the use of a differential temperature gradient across a reactor 18. The temperature gradient can be established across the growth chamber of the reactor 18 using multiple external heating coils or any other suitable methodology. The supersaturated zone 14 can be held at a slightly lower temperature as compared to the nutrient rich zone 12. The temperature gradient typically ranges from about 5° C. to about 50° C. and also has an effect on the rate and quality of the growth layer. Referring again to FIG. 1, a nutrient rich zone 12 can be heated and feedstock 22 can dissolve in the hot hydrothermal fluid. The solution in the nutrient rich zone 12 can become a saturated solution. Consequently, the solution in the nutrient rich zone 12 can convect upward through the baffle 20 and into the supersaturated zone 14 where it will cool and become supersaturated. The dissolved feedstock can begin to come out of solution and build upon the crystal structure of the seed crystal 16. The process will continue until stopped or the feedstock supply is consumed. Typically layer 24 can grow from about 30 to about 150 micrometers (μm) in thickness per day depending on the host material, temperature gradient, mineralizer type, and dopant concentration.

Among the advantages of a hydrothermal crystal growth process are the relatively low operating temperatures. For instance, a growth process can generally be carried out with upper temperatures of between about 500° C. and about 650° C., or between about 450° C. and about 650° C., which can be 800° C. to 1200° C. lower than a liquid phase epitaxy method. This can simplify operating conditions and drastically minimize the amount of thermal strain regions of a forming crystal. The thermal gradient between the two zones 12, 14 of a reactor can likewise vary according to specific materials and growth rates desired, but typically can be between about 20° C. and about 100° C.

Another advantage of the hydrothermal growth process is that the feedstock maintains a constant concentration in solution during the growth run. Thus, once a partition coefficient is determined for the doping ion relative to the host, that concentration can be established in the solution using the appropriate concentration of dopant in the feedstock, and a constant concentration of dopant can be maintained in solution and hence throughout the lattice during growth.

In general, growth rate of a developing region can be between about 1 and about 5 μm per hour, or between about 30 and about 150 μm per day. The identity and concentration of a dopant typically has little effect on the rate of layer growth. Rather, the rate of crystal growth can be controlled by the identity and concentration of a mineralizer as well as the temperature gradient across the reactor and the nature of the host material. The relatively slow growth rates possible can be beneficial as this can allow for precise control of the thickness of the forming crystal. For example, a process can reliably grow a region at about 2 μm/hour or about 25 μm/day and can thus be used to grow a region of about 100 microns over four days. Beneficially, layers of any desired size, for instance up to about 10 millimeters, can be grown over a predetermined time period. Such thicknesses are suitable for a number of waveguide applications if the layers are lateral (parallel to the pump beam) and for multiple layers with varying doping ion concentrations to form gradient doping. These layers are particularly suitable for thin disk applications where high power is important and thermal effects must be minimized.

Generally, growth rate can vary between about 1 μm/hour and about 5 μm/hour, with preferred growth conditions for any specific system specific to the particular host material. Thus for example, when considering $M_2O_3$ oxide host material, a concentrated hydroxide (about 10M to about 30M) mineralizer can be used and the thermal conditions can be at the high end of the range (lower and upper zones at, e.g., about 600° C. and about 650° C., respectively). In the case of $YVO_4$ a lower concentration (e.g., about 0.1M to about 2M) hydroxide mineralizer can be used at somewhat lower temperatures (e.g., lower and upper zones at about 400° C. and about 480° C.).

Following formation of a first layer 24, the hydrothermal process can be repeated using a different feedstock 22. According to one embodiment, successive layers with varying concentrations of a single dopant can be grown to create a concentration gradient across the formed crystal. In one embodiment, following formation of a plurality of doped layers, an additional undoped epitaxial layer can be subsequently grown on the final doped layer, for instance to create a waveguide device.

Typically the layer thickness of each epitaxially grown layer can range from approximately 30 μm to multiple millimeters as desired. It is a straightforward matter to vary the dopant identity and concentration within each layer merely by varying the contents of the feedstock. Thus each of the layers can be grown in succession by simply placing the previously formed layered crystal in an autoclave as a seed with a feedstock appropriate for the desired doping concentration of the next layer. In those embodiments in which the layers are thin (e.g., between about 30 and about 50 μm), each layer can be grown within about a 24-hour period, enabling numerous layers to be grown over a few days.

The multiple epitaxial layers can range in thickness from about 20 μm to multiple millimeters. Using a careful growth rate, layers can be grown that display no defects or light scattering relative to the substrate layer. Repeat growths on the same substrate allow for the production of a wide variety of multifunctional single crystals that can perform a number of lasing operations. Furthermore the layers can have sharp interfaces with distinct gradient profiles or alternatively, they can be heated using methods well known to workers in the field (J. Ganguly Reviews in Mineralogy and Geochemistry 2010, 72, 559-601) to diffuse the dopants to generate smooth concentration curves.

A significant aspect of the method is the thickness of the hydrothermally grown epitaxial layers. The layers can be grown a variable rate depending the chemical system, mineralizer and temperature profile but a typical growth rate can range from about 30 μm to about 150 μm per day. Thus over a convenient 24-hour period a systems can be heated to growth temperature and a layer of thickness of about 30 μm to about 50 μm can be grown reliably and conveniently. A layer of such a thickness can be suitable as the active layer for a waveguide laser crystal. Once such a layer is grown, the crystal can then be placed in another growth reaction for a longer period of time (multiple days) whereby a thicker layer of the original host material can be grown on top of the active layer effectively creating a waveguide laser.

The hydrothermal epitaxial layer growth has an additional advantage in that the area of the resultant laser crystal can be varied over a wide range and is only a function of the substrate crystal and the internal diameter of the autoclave. Since hydrothermal autoclaves with internal diameter of many inches, and even feet, are known to experts in the field (see, e.g., Byrappa, Yoshimura "Handbook of Hydrothermal Technology" Noyes Publications Park Ridge N.J. 2001), the only limitation can be the size of the crystal seed. The available size of crystal seeds generally varies with the host material of the seed. For instance, in the case of YAG, large oriented seeds with diameters of 2-3 inches are relatively inexpensive and commercially available. Thus it can be convenient to prepare large area thin disks for thin disk lasers and long wide waveguide laser crystals. In the case of thin disks, 1 $cm^2$ size is an industry standard but power varies with disk area so disks having a larger face area, for instance about 4 $cm^2$ can be preferred for high power applications. Such larger area multifunctional crystals are somewhat difficult to manufacture using typical current diffusion bonding methods, even for one diffusion-bonded layer. However the methods described herein enable convenient production of much larger area disks with multiple layers. Similarly the method allows for convenient production of planar waveguide laser crystals having a length of from about 2 cm or about 3 cm to about 5 cm, or even longer if desired.

The hydrothermal epitaxial growth method has the advantage in that it is convenient to tune the lattice size of the layers and the refractive index of the layers conveniently. Thus in the case of YAG for example the addition of dopant lasing ions such as $Nd^{3+}$ or $Yb^{3+}$ can increase the refractive index slightly because the electronic number of these elements are larger than yttrium. The size of the lattice increases only marginally because of the generally low concentration of the dopant. The refractive index increases measurably with addition of heavier atoms. Thus the systematic substitution of Lu for Y or Ga for Al in a particular epitaxial layer can increase the refractive index of that layer. This of course is the basis for classical fiber optic performance where Ge is partially substituted for Si in the core of a silica fiber creating a total internal reflectance condition for the core relative to the pure silica fiber with a lower refractive index. The ability to vary the refractive index systematically allows for convenient index matching over the various layers of a thin disk or the creating of total internal reflectance for waveguides. Since neither Lu nor Ga is electronically active they can be substituted over a wide range with minimal effect on the lasing behavior.

The subsequent layers can be doped with a wide variety of different ions and varied concentration of the same or different ions between adjacent layers. In general, the lattice size of the material that is formed according to the hydrothermal growth method can be relatively close to that of the immediately adjacent layer (e.g., the seed crystal 16 in the case of the layer 24 of FIG. 1) so as not to induce too much strain. In general, desired dopants (e.g., trivalent lanthanide ions) in the useful amounts (usually less than or equal to about 10 atomic percent) will not generate significant lattice mismatches between layers. Thus a wide range of dopant layers can be grown as single crystals utilizing host materials as are generally known in the art.

Conveniently, the ionic radii of the ions move in opposing directions to the atomic number due to the well-known lanthanide contraction. Thus, the ionic radius of Lu is smaller than that of Y, while that of Ga is larger than that of Al, and that of Gd is larger than that of either Y or Lu. Such size variation provides a convenient series of chemical "knobs" to tune size of the lattice and obtain good lattice match between adjacent regions of the crystal. Thus if an increase in refractive index is desired for a crystal based on a YAG host material, Lu can be substituted for Y in some percentage while a similar percentage of Ga can be substituted for Al. Both of these substitutions will increase the refractive index of that layer but the changes in lattice size will counteract each and result in almost lattice size mismatch. Thus, the refractive index can be increased while the lattice size remains essentially the same as YAG. The degree of substitution can thus be dictated by the desired refractive index value. Such size matching can minimize any strain due to mismatch of unit cell lattice mismatch and reduce any thermal distortions of crystal damage. The substitution can be accomplished over a wide range of element percentages for the various garnets. Similar index matching can be performed with $Lu_2O_3$ or $Y_2O_3$ host materials, with new epitaxial layers doped with smaller $Sc^{3+}$ or larger $La^{3+}$ for example, to vary both size and refractive index over a desired range.

A wide variety of doping ions concentration and identity can be readily envisioned as variations. In addition, they can be extended to any host material. Such variation of the lanthanide host ion site as well as the partial substitution of Al with various concentrations of gallium can serve to vary the lattice size to provide a good match of the layers and also vary the index of refraction to provide an excellent refraction match. A good lattice match and a versatile refractive index match can provide enhanced performance for LGM including both waveguide laser crystals and gradient doping thin disk laser crystals.

After all of the desired layers have been grown, the resultant heterogeneous single crystal can be processed as desired to form, e.g., an LGM. For instance, a heterogeneous crystal can be optically polished using methods well known to workers in the field and coated with dielectric coatings again using methods well known to workers in the field. Such coatings can be selectively reflecting or anti-reflecting at specified wavelengths as appropriate for the desired laser design. In addition, a dopant ion concentration gradient across the heterogeneous crystal can be smoothed by the application of heat to the formed heterogeneous crystal. For instance, the crystal can be heated to a temperature of from about 1200° C. to about 1500° C.

In one embodiment, the final heterogeneous crystal can include a distribution of lasing ions over a smooth curve and thicker undoped layers on either side of the concentration gradient. Such a heterogeneous crystal can be used where thermal management is vital for good laser performance as in high power thin disk lasers for example (A. Giesen, J. Speiser "Fifteen Years of Work on the Thin Disk Laser: Results and Scaling Laws" IEEE Journal of Selected Topics in Quantum Electronics 13, 2007, 598-609). In such cases the gradient of doping ions can cause a gradual absorption of pump photons within the bulk crystal lattice. Since the photons are absorbed gradually as the pump beam passes through an increasing concentration of laser ions, the resultant thermal distortion can be greatly decreased. When the onset of absorption begins at some depth within the bulk lattice due to the presence of an undoped endcap, there can be minimal damage to dielectric coatings. Also, there can be minimal thermal lensing and other deleterious effects. Further, since the absorption occurs gradually as the pump beam passes through the gradient doping zone any resultant thermal stress can be minimized because the stress is distributed over a wide area rather than localized at some single interface.

According to another embodiment, a doped epitaxial layer suitable for laser waveguide applications can be grown on a suitable seed crystal. Specifically, the doped layer can have a different refractive index from the substrate. For example, the substrate material can include Yttrium as a parent host ion and the epitaxial layer can be doped with lasing ions such as Yb, Er or Nd such that the refractive index of the epitaxial layer can increase due to the presence of the larger, more polarizable lanthanide ion. Growth of a second epitaxial layer of undoped host material on the doped lasing layer can create a three-part crystal with a thin internal layer that has a greater refractive index than the cladding layers, creating a total internal reflectance within the lasing layer that can serve in a waveguide laser application. After growth, the doped epitaxial layer can be modified to remove a portion of the layer at each end perhaps but not limited to about 5% of the total length of the epitaxial layer leaving the original substrate layer intact (see FIG. 7 and description below). This removal can be effected by any one of a number of oxide removal techniques well known to practitioners of the area and these include ion milling, chemical mechanical polishing or physical polishing. One or more of the end portions can be removed and the crystal can then be placed back in a reactor with undoped feedstock to grow a layer of host material over the doped epitaxial layer. After polishing to remove excess substrate the product crystal can be a completely embedded waveguide and can serve as a waveguide laser crystal with a fully embedded waveguide layer with endcaps at both ends, and as such can avoid thermal distortion, thermal lensing or other thermal damage during use.

The refractive index of the layers can also be modified by systematically replacing the host Y ions with isoelectronic Lu ions and the aluminum ions with gallium ions. Both Lu and Ga will increase refractive index with respect to Y and Al respectively while Lu is smaller than Y but Ga is larger than Al. Thus lattice size and refractive index can be tuned over a wide range, enabling the production of a wide variety of waveguide based laser crystals. (MacKenzie IEEE J. Selected Topics in Quant. Elec. 13, 2007, 626-637 and Cantelar et al. Optical Materials 34 (2012) 555-571 and Ferrand et al. Optical Materials 11 (1999) 101-114).

A single heterogeneous crystal can be used in forming thin disk lasers. In this application high power laser radiation can be generated from an appropriate laser crystal through a thin disk design. An important aspect of this application is a thin layer of a host material doped with a suitable lasing ion. This thin, doped layer is on an undoped substrate of the same or similar material. The substrate can serve as a mounting aid to attach the disk to a heat sink to remove waste heat. Removal of waste heat is particularly important in thin disk lasers because considerable heat builds up at high operating power. Because of this the thin disk crystal can suffer thermal damage, lensing distortion or other deleterious thermal effects. Thus it can be desirable to have the thin lasing region be embedded between two thicker endcaps layers. Also it can be desirable to have a gradient doping of lasing ions to disperse the strain resulting from the thermal buildup.

The hydrothermally grown layers described herein can be combined with other known processes to create many useful devices. For example, other epitaxial layers can be grown upon the waveguide structure that can have other functionalities. By way of example, cladding layers containing ions capable of absorbing the emitted wavelength can be grown around the edges of a heterogeneous crystal such as, without limitation $Cr^{3+}$, $Co^{3+}$, $Sm^{3+}$, $Cu^{2+}$, $Co^{2+}$, $Ni^{2+}$, $Cr^{4+}$, or combinations thereof. These layers can have the effect of absorbing any amplified spontaneous emission (ASE) or parasitic oscillation effects. Since ASE is one of the major effects limiting performance of waveguide lasers this can have a major improvement on laser performance.

The hydrothermal epitaxial method provides a number of advantages over existing technology for various LGM with gradient doping or waveguide structures. The method can be used to grow thin layers with large surface areas with the only limitation being the area of the substrate. Also the method is simple and straightforward, so multiple layers can be grown simply by placing a seed crystal into a reactor autoclave containing the appropriate feedstock with no further manipulation such as optical polishing. The method is very versatile and a substrate of any shape can have epitaxial layers grown on numerous sides at the same time. These factors combine to allow a great deal of functionality to be included in a small or large crystal. The method is performed at a relatively low temperature and eliminates the need for any flux, which is often toxic and can contaminate the growth layers. In addition the method can be applied to any system for which hydrothermal crystal growth has already been demonstrated. Thus it can be extended to other LGM including, as non-limiting examples, doped $YVO_4$, or doped $M_2O_3$ (M =Sc, Y, Lu) as described in U.S. Pat. Nos. 7,211,234 and 7,563,320, incorporated by reference.

The present disclosure may be better understood with reference to the Prophetic Examples, set forth below.

PROPHETIC EXAMPLE 1

Figure 2:
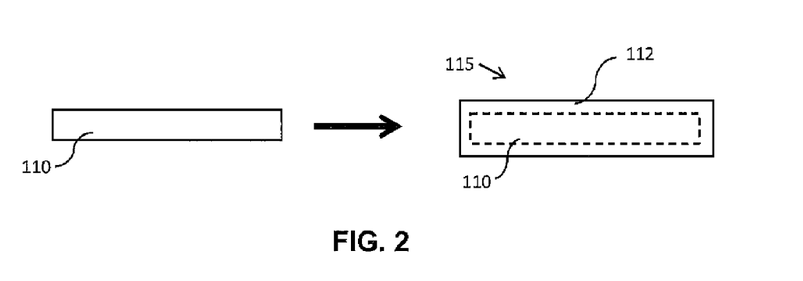
FIG. 2 schematically illustrates hydrothermal epitaxial growth of a doped layer on a substrate.

With reference to FIG. 2, a substrate seed 110 of undoped YAG having dimensions of 1 mm×5 mm×20 mm is placed in an autoclave and a layer 112 of 1% Nd doped YAG is grown according to a hydrothermal formation process to a thickness of 40 microns over a 24 hour period. The feedstock can include $Y_2O_3$, $Al_2O_3$ and a 1% atomic equivalent $Nd_2O_3$. The hydrothermal process solution can be a mineralizer solution of 2-5M $K_2O_3$ in water. The thermal gradient can be established with the bottom of the autoclave heated to 650° C. and the top heated to 630° C. The layer 112 is smooth and homogeneous and covers the entire surface of the substrate seed 110 to form a first heterogeneous crystal 115.

Figure 3:
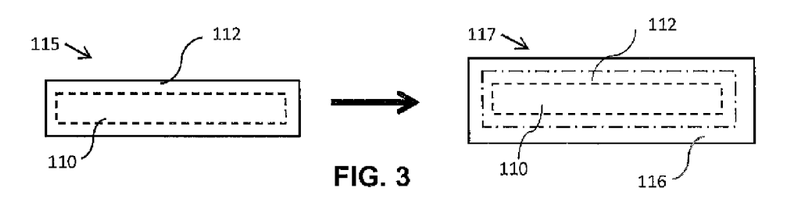
FIG. 3 illustrates growth of an additional layer on the layered substrate of FIG. 1, the additional layer matching the material composition of the substrate to form a waveguide crystal.
Figure 4:
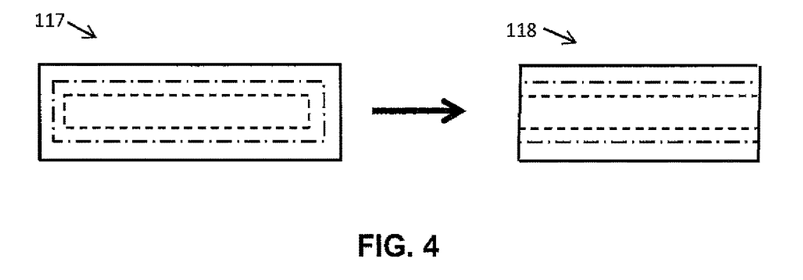
FIG. 4 illustrates further processing of the waveguide crystal of FIG. 3.

Following this initial process, and as illustrated in FIG. 3, the crystal 115 can be placed in an autoclave with a feedstock of $Y_2O_3$, $Al_2O_3$ under conditions as utilized for formation of the layer 112 to form a second layer 116 of undoped YAG 1 mm thick over the entire surface of the crystal 115 creating heterogeneous crystal 117. The difference in refractive index between the doped layer 112 and the undoped layers 110, 116 creates a total internal reflectance in the doped layer. As illustrated in FIG. 4, after suitable cutting, polishing and coating of the ends of the crystal 117 a planar waveguide laser crystal 118 is obtained.

PROPHETIC EXAMPLE 2

Figure 5:
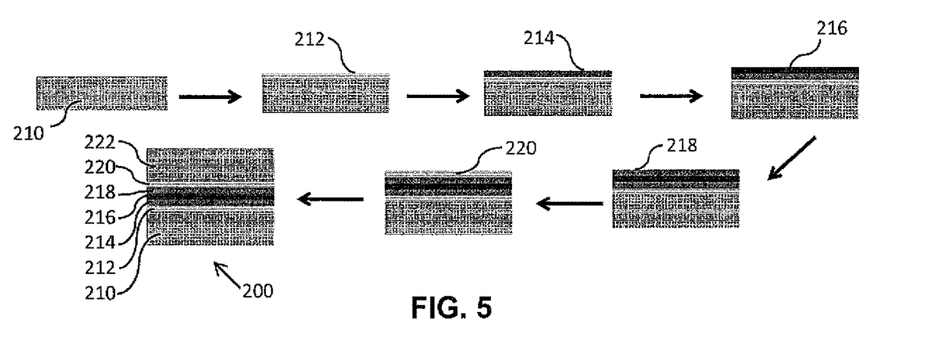
FIG. 5 illustrates a hydrothermal epitaxial growth process in which multiple layers, each differing from an immediately adjacent layer, are grown in subsequent growth runs.
Figure 6A:
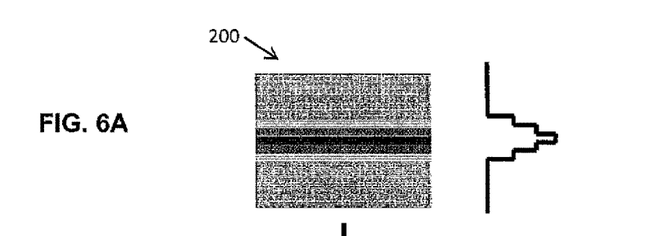
Figure 6B:
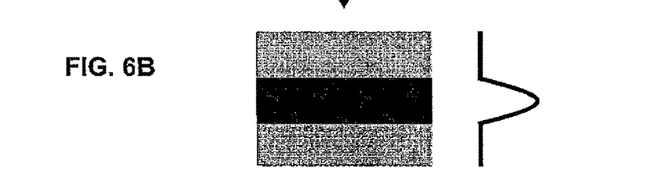

As shown in FIG. 5, an undoped [100] oriented LuAG substrate crystal 210 about 1 $cm^2$ on one face and 1 mm thick can be placed in an autoclave and a layer 212 of 2% Yb doped LuAG can be grown to a thickness of 30 microns over a 24 hour period. The same crystal can then can be placed in a new autoclave with a new feedstock for a day to form another 30 micron thick layer 214 of 5% doped Yb:LuAG. The process is repeated with a layer 216 of 10% doped Yb:LuAG followed by a layer 218 of 5% Yb:LuAG then a layer 220 of 2% Yb:LuAG and a final thicker layer 222 (1 mm thick) of undoped LuAG. This product 200 is shown at FIG. 6A in conjunction with a graphical representation of the concentration gradient of the dopant across the crystal 200. Upon further processing of the crystal 200 through heating for several hours, the dopant ions can diffuse slightly through the layers to produce a smooth concentration gradient of dopant embedded in the host lattice as shown at FIG. 6B.

The final product can then be polished on the largest face to produce a disk that has a smooth gradient to dopant ions suitable for thin disk laser applications. The disk can be mounted in a conventional thin disk laser device well known to experts in the art. The product can have an undoped endcap to minimize thermal distortion of the beam and a smooth curve of concentration gradient of lasing ion which can serve to minimize any thermal strain upon pumping and distribute any residual thermal strain over a large portion of the crystal that can serve to minimize thermal distortion to improve beam quality as well as minimize cracking damage to the crystal at high power operations. Specifically, if the crystal is pumped normal to the layers then the onset of absorption will be gradual over the path length of the crystal which will moderate the thermal effects during lasing, decreasing such deleterious effects as thermal lensing. The gradual increase in laser ions concentration over the path length can also lead to a flat absorption profile, rather than a variable one, which can also increase lasing efficiency.

PROPHETIC EXAMPLE 3

Figure 7:
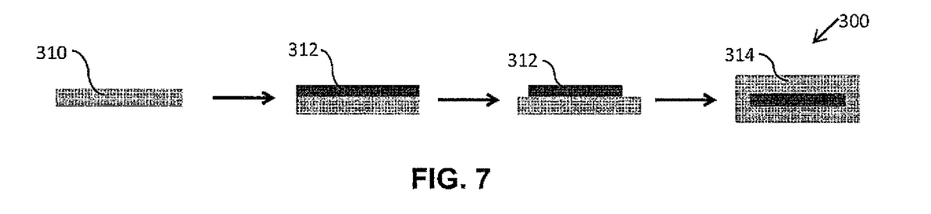
FIG. 7 illustrates a formation method including removal of a portion of a doped layer followed by development of another layer of host material resulting in an embedded waveguide crystal.

A single heterogeneous crystal can be formed for use as a waveguide laser as illustrated in FIG. 7. A single crystal seed 310 having a relatively large surface area on a face (e.g., about 3 square centimeters) of YAG is placed in a reactor with a feedstock including $Y_2O_3$, $Al_2O_3$ and a desired amount of dopant ion such as 1-10% atomic equivalent of $Yb_2O_3$ or $Nd_2O_3$. With a mineralizer solution of 2-5M $K_2O_3$ in water, the seed crystal can be placed in the top half of the autoclave while the feedstock materials can be placed in the bottom of the autoclave as illustrated in FIG. 1. A thermal gradient can be established with the bottom of the autoclave heated to 650° C. and the top heated to 630° C. Over 24 hours a new epitaxial layer 312 of doped YAG about 40 microns thick can be grown on all faces of the substrate seed (shown in FIG. 7 on a single face). The new layer can be polished so as to remove the layer 312 from all but a portion of a single face of the layer 310, and placed into another reactor at the same conditions as above except without the dopant material. The growth reaction can be maintained for a longer period of time (7-10 days for example) to grow the thicker layer 314 (250 microns for example). Because the refractive index of the doped layer 312 is increased relative to the two cladding layers 310, 314 by the addition of the dopant ions in the thin layer 312, a condition of total internal reflectance is established, creating a large area planar waveguide 300.

PROPHETIC EXAMPLE 4

Figure 8:
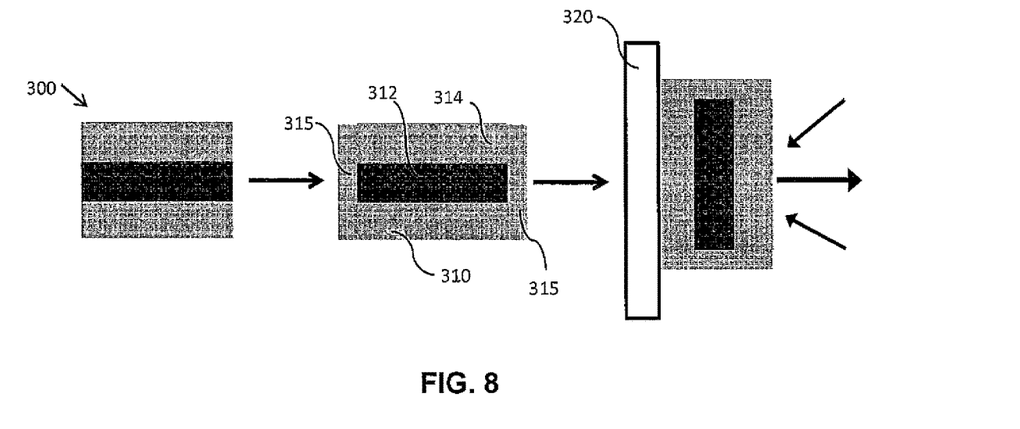
FIG. 8 illustrates one method of utilization of a single heterogeneous crystal including end caps in a thin disk arrangement with a heat sink.

As shown in FIG. 8, the ends and sides of a heterogeneous crystal 300 as described in Prophetic Example 3 including a thin layer 312 that incorporates an active dopant surrounded by layers 310, 314 of an undoped host material can be optically polished and coated with appropriate dielectric coatings 315, as is well known to the field, creating a suitable heterogeneous crystal. When used in a thin disk arrangement with a heat sink 320 the pumping and emission of the disk can occur through regions of the disk not coated with the dielectric coatings 315.

PROPHETIC EXAMPLE 5

A 1 $cm^2$ single crystal of YAG with a face of [100] orientation and thickness of 1-2 mm (readily available commercially) is placed in the top part of the autoclave as illustrated in FIG. 1. A feedstock consisting of microcrystals or powders of $Y_2O_3$ and 1-2 atomic % of $Nd_2O_3$ as well as an excess of sapphire ($Al_2O_3$) crystals are placed in the bottom of the autoclave. A solution of 4M $K_2CO_3$ in water is added to the autoclave to fill the available volume to approximately 70%. The autoclave is sealed and at least two heating elements are placed around the outer part of the autoclave to heat the top part of the autoclave to approximately 630° C. and the bottom of the autoclave to 650° C. After 24 hours at these conditions the apparatus is cooled to room temperature and the seed removed. The product now consists of the original YAG seed with a layer of Nd doped YAG grown on all sides of the substrate to a thickness of approximately 30-40 microns. The 1 $cm^2$ faces can be polished, if desired to ensure a smooth face, using methods well known to experts in the field. The edges can also be polished to remove the new growth laser.

The formed heterogeneous crystal is rehung on a ladder and placed in an autoclave as before with the feedstock containing only $Y_2O_3$ powder or crystals and $Al_2O_3$ crystals. With a similar mineralizer solution and heating conditions, the reaction is maintained for 7-14 days. After removal the product now has a layer of undoped YAG single crystal on all faces with a thickness of 200-300 microns on the large [100] faces. The crystal can be sliced in half through the original plate to create two identical products. After appropriate cutting and polishing of ends, the final product is an embedded waveguide of 30 micron layer of Nd:YAG between cladding layers of undoped YAG.

A similar procedure can be accomplished using either pre-doped Nd:$Y_2O_3$ or premade Nd:YAG crystalline powder as the feedstock. The procedure can be modified to include any of the suitable trivalent lanthanide lasing ions including but not limited to $Yb^{3+}$, $Ho^{3+}$, $Tm^{3+}$ or $Er^{3+}$ in any reasonable concentration. It can also include but is not limited to, co-doped dopants such as mixtures of $Er^{3+}$ and $Yb^{3+}$ or $Tm^{3+}$ and $Ho^{3+}$ or $Nd^{3+}$ and $Ca^{2+}$ and $Cr^{4+}$.

PROPHETIC EXAMPLE 6

A reaction is performed as in Prophetic Example 5 but a mixture of 50% $Y_2O_3$ and 50% $Lu_2O_3$ is used as a host material in the feedstock along with 1-2 at. % $Nd_2O_3$ and excess $Al_2O_3$ crystals. This will produce following hydrothermal growth a 30-40 micron thick waveguide layer with a mixture of Y and Lu in the lattice along with the dopant. The mixed host ions will increase the refractive index of the waveguide layer without inducing any undue strain on the waveguide layer because the lattice match is sufficiently close. The second step of growth of the cladding layer uses undoped $Y_2O_3$ as the host as described in Prophetic Example 5. The resultant product is a waveguide laser crystal with a greater difference in the refractive index and hence a greater total internal reflectance angle for the waveguide.

PROPHETIC EXAMPLE 7

A single crystal of YAG with a face of [100] orientation, which is 1 cm wide and 5 cm long and thickness of 1-2 mm (readily available commercially) is placed in the top part of an autoclave. A feedstock consisting of microcrystals or powders of $Y_2O_3$ and 1-2 atomic % of $Nd_2O_3$ as well as an excess of sapphire ($Al_2O_3$) crystals are placed in the bottom of the autoclave as above and a layer of Nd doped YAG grown on all sides of the substrate to a thickness of approximately 30-40 microns as above. The resultant epitaxial layer has 5 mm of the doped layer removed from the substrate using ion milling. The resultant crystal is rehung on a ladder and placed in an autoclave as above with the feedstock containing only $Y_2O_3$ powder or crystals, and $Al_2O_3$ crystals. With a similar mineralizer solution and heating conditions, the reaction is maintained for 14-21 days. After removal the product now has a layer of undoped YAG single crystal on all faces with a thickness of 1 mm thick on the large [100] faces. After appropriate cutting and polishing of ends, the final product is a fully embedded waveguide of 30 micron layer of Nd:YAG between cladding layers of undoped YAG.

PROPHETIC EXAMPLE 8

A 2 $cm^2$ single crystal of LuAG with a face of [100] orientation and thickness of 1-2 mm (readily available commercially) is placed in the top part of an autoclave as illustrated in FIG. 1. A feedstock consisting of microcrystals or powders of $Lu_2O_3$ and 2 atomic % of $Yb_2O_3$ as well as an excess of sapphire ($Al_2O_3$) crystals is placed in the bottom of the autoclave. A solution of 2M $K_2CO_3$ in water is added to the autoclave to fill the available volume to approximately 70%. The autoclave is sealed and at least two heating elements are placed around the out part of the autoclave to heat the top part of the autoclave to approximately 630° C. and the bottom of the autoclave to 650° C. After 24 hours at these conditions the apparatus is cooled to room temperature and the seed removed. The product now consists of the original LuAG seed with a layer of Yb doped LuAG grown on all sides of the substrate to a thickness of approximately 30 microns. The crystal is then placed in an autoclave as above with the feedstock consisting of microcrystals or powders of $Lu_2O_3$ and 5 atomic % of $Yb_2O_3$ as well as an excess of sapphire ($Al_2O_3$) crystals. With a similar mineralizer solution and heating conditions, the reaction is maintained for 24 hours. The crystal is then placed in an autoclave as above with the feedstock consisting of microcrystals or powders of $Lu_2O_3$ and 10 atomic % of $Yb_2O_3$ as well as an excess of sapphire ($Al_2O_3$) crystals. With a similar mineralizer solution and heating conditions, the reaction is maintained for 24 hours. The crystal is then placed in an autoclave as above with the feedstock consisting of microcrystals or powders of $Lu_2O_3$ and 5 atomic % of $Yb_2O_3$ as well as an excess of sapphire ($Al_2O_3$) crystals. With a similar mineralizer solution and heating conditions, the reaction is maintained for 24 hours. The crystal is then placed in an autoclave as above with the feedstock consisting of microcrystals or powders of $Lu_2O_3$ and 2 atomic % of $Yb_2O_3$ as well as an excess of sapphire ($Al_2O_3$) crystals. With a similar mineralizer solution and heating conditions, the reaction is maintained for 24 hours. The crystal is then placed in an autoclave as above with the feedstock containing only $Lu_2O_3$ powder or crystals, and $Al_2O_3$ crystals. With a similar mineralizer solution and heating conditions, the reaction is maintained for 7-14 days. After removal the product now has a layer of undoped LuAG single crystal on all faces with a thickness of 200-300 microns on the large [100] faces. The crystal is heated in a platinum crucible in an oven in air to 1200° C. for 4-6 hours to induce modest diffusion of the $Yb^{3+}$ dopant ions to form smooth concentration curve of doping ions. The product can be cut in half through the large faces to create two identical final products. Each can be optically polished on the large faces and coated with dielectric films for reflectance and anti-reflectance coatings as desired according to methods well known to those in the laser design art.

The final product consists of an undoped LuAG substrate, a 150 micron thick layer containing gradual profile of dopant ions, and a thicker layer of undoped LuAG to serve as an endcap. After polishing the large faces can serve as the target faces for a thin disk laser.

A similar procedure can be accomplished using either predoped Yb:Lu$_2$O$_3$ and Al$_2$O$_3$, or premade Yb:LuAG crystalline powder as the feedstock. The procedure can be modified to include any of the suitable trivalent lanthanide lasing ions including but not limited to Nd$^{3+}$, Ho$^{3+}$, Tm$^{3+}$ or Er$^{3+}$ in any reasonable concentration. It can also include but is not limited to, co-doped dopants such as mixtures of Er$^{3+}$ and Yb$^{3+}$ or Tm$^{3+}$ and Ho$^{3+}$ or Nd$^{3+}$ and Ca$^{2+}$ and Cr$^{4+}$. The procedure can also be modified for any combinations of YAG and LuAG as the host materials.

PROPHETIC EXAMPLE 9

The product described in Prophetic Example 7 can be subsequently placed in an autoclave as described above along with a feedstock consisting of Lu$_2$O$_3$, Al$_2$O$_3$ and a dopant source consisting or Co3+ (Co$_2$O$_3$ CoCl$_3$ etc.) or large excess of Cr$^{4+}$ or a related ion, that can absorb spontaneously emitted radiation in the 1-micron wavelength range. Under conditions described reaction is maintained for 7 days. The result is a coating of LuAG containing absorber ion as dopant. The resultant layer is polished off the large faces while maintaining the cladding around all the edges. The resultant edge cladding containing the absorber ion will serve as an ASE suppression layer for the thin disk laser crystal. (FIG. 8)

PROPHETIC EXAMPLE 10

A Lu$_2$O$_3$ crystal with 1 cm$^2$ [100] faces and 1 mm thickness is mounted as described above and placed an autoclave as described illustrated in FIG. 1. A feedstock of 10% Yb$_2$O$_3$ and 90% Lu$_2$O$_3$ is added and an aqueous solution of 10M KOH in water is added to a fill level of 70% of available free space in the autoclave. After sealing the autoclave is heated to 680° C. in the bottom and 650° C. in the top zone. After 7 days the crystal is removed and has a layer of 40-100 microns of 10% doped Yb:Lu$_2$O$_3$ surrounding the seed. After appropriate cutting and polishing to create a new crystal with a doped layer of desired thickness on it, the seed is placed back in an autoclave with a pure Lu$_2$O$_3$ feedstock and similar mineralizer and solution as above. After 10-14 days at growth temperatures above, the crystal contains a thicker cladding layer of undoped Lu$_2$O$_3$ on the surface. After polishing a thin disk is obtained that contains a substrate layer of Lu$_2$O$_3$ with a thin doped layer of Yb:Lu$_2$O$_3$ to serve as a lasing layer and another undoped Lu$_2$O$_3$ layer on the top to serve as an undoped endcap to inhibit thermal damage and partially mitigate ASE. If desired the disk can subsequently be placed in an autoclave and a feedstock of 90% Lu$_2$O$_3$ and 10% Co$_2$O$_3$ or CrCl$_3$ along with 10M KOH solution can be added. After growth under similar conditions for 7-14 days a cladding layer of Co:Lu$_2$O$_3$ is grown around all edges. After polishing away the cladding on the large faces and leaving the edges clad with doped with Co:Lu$_2$O$_3$, the crystal has ASE suppression cladding.

PROPHETIC EXAMPLE 11

Lu$_2$O$_3$ crystal with 1 cm$^2$ [100] faces and 1 mm thickness is mounted as described above and placed an autoclave. A feedstock of 2% Yb$_2$O$_3$ and 90% Lu$_2$O$_3$ is added and an aqueous solution of 10M KOH in water is added to a fill level of 70% of available free space in the autoclave. After sealing the autoclave is heated to 680° C. in the bottom and 650° C. in the top zone. After 3-5 days the crystal is removed and has a layer of 30-40 microns of 2% doped Yb:Lu$_2$O$_3$ surrounding the seed. The seed is then successively placed in autoclaves with feedstocks of 5%, 10% 5% and 2% Yb$_2$O$_3$ respectively to obtain gradient doping of Yb:Lu$_2$O$_3$ layers on the face. After growth of an undoped end cap, the crystal is heated to 1000° C. to induce mild diffusion of the dopant ions. After suitable polishing and coating, a single crystal suitable for thin disk laser applications is produced. The crystal contains an undoped substrate, a gradient doping active lasing region and an undoped endcap.

In all cases the size of the thin disk crystal is only limited by the size of the single crystal substrate. The doping ions can include any of the trivalent lasing ions including but not limited to, Er, Tm, Ho and Nd in any reasonable concentration. In addition the host can include the other traditional ions such as Sc and Y.

While certain embodiments of the disclosed subject matter have been described using specific terms, such description is for illustrative purposes only, and it is to be understood that changes and variations may be made without departing from the spirit or scope of the subject matter.

What is claimed is:

1. A heterogeneous monolithic thin disk laser single crystal comprising:
    a first layer, the first layer comprising a host material, the host material being undoped in the first layer;
    a second layer, the second layer comprising the host material and a lasing ion dopant; and
    a third layer, the third layer comprising the host material, the host material being undoped in the third layer, the second layer being between the first layer and the third layer;
    wherein, the heterogeneous monolithic thin disk laser crystal has a face having a diameter of about 1 centimeter or larger, and the second layer has a thickness of between about 30 micrometers and about 150 micrometers.

2. The heterogeneous monolithic thin disk single crystal of claim 1, further comprising a fourth layer that is immediately adjacent to the second layer, the fourth layer comprising the host material and the lasing ion dopant, wherein the concentration of the lasing ion dopant in the fourth layer differs from the concentration of the lasing ion dopant in the second layer.

3. The heterogeneous monolithic thin disk single crystal of claim 1, wherein the second layer comprises the lasing ion dopant in a concentration gradient across the thickness of the second layer.

4. The heterogeneous monolithic thin disk single crystal of claim 1, wherein the refractive index of the first layer and the refractive index of the second layer are matched.

5. The heterogeneous monolithic thin disk single crystal of claim 1, wherein the second layer further comprises an Lu dopant and/or a Ga dopant.

6. The heterogeneous monolithic thin disk single crystal of claim 1, wherein the host material is a garnet, a vanadate, a rare earth sesquioxide, a spinel, or a borate.

7. The heterogeneous monolithic thin disk single crystal of claim 1, wherein the active lasing ion dopant is Nd, Yb, Er, Ho, or Tm.

8. The heterogeneous monolithic thin disk single crystal of claim 1, wherein the heterogeneous monolithic thin disk crystal has one or more edges, the crystal further comprising a cladding layer on the one or more edges.

9. The heterogeneous monolithic thin disk crystal of claim 8, the cladding layer comprising an absorber ion that absorbs spontaneously emitted radiation.

10. A method for forming the heterogeneous monolithic thin disk crystal of claim 1, the method comprising:
heating and pressurizing an aqueous solution held within a reactor to develop a temperature differential between a first zone of the reactor and a second zone of the reactor, the reactor containing a feedstock in the first zone and a seed crystal in the second zone, the seed crystal including the host material, the feedstock including a source for forming the host material and a source for the lasing ion dopant, wherein upon said heating and pressurizing growth of the second layer is initiated on the seed crystal to form an intermediate crystal including the second layer and including the seed crystal as the first layer; and
heating and pressurizing a second aqueous solution held within a second reactor to develop a temperature differential between a first zone of the second reactor and a second zone of the second reactor, the second reactor containing a second feedstock in the first zone and the intermediate crystal in the second zone, the second feedstock including a source for forming the host material, wherein upon said heating and pressurizing growth of the third layer is initiated on the intermediate crystal, the heterogeneous monolithic thin disk single crystal including the first, second and third layers.

11. The method according to claim 10, further comprising forming one or more additional layers on the intermediate crystal prior to formation of the third layer on the intermediate crystal, the one or more additional layers including the host material and the lasing ion dopant, the concentration of the lasing ion dopant differing in the one or more additional layers from the concentration of the lasing ion dopant in the second layer, the different concentrations of the lasing ion dopant forming a lasing ion dopant concentration gradient across the heterogeneous monolithic thin disk single crystal.

12. The method according to claim 11, further comprising heating the heterogeneous monolithic thin disk single crystal to smooth the lasing ion dopant concentration gradient across the one or more additional layers and the second layer.

13. The method according to claim 10, further comprising forming one or more additional layers on the heterogeneous monolithic thin disk crystal following formation of the third layer.

14. A monolithic single crystal waveguide comprising:
a first layer, the first layer comprising a host material;
a second layer, the second layer comprising the host material and a lasing ion dopant, wherein the active lasing ion dopant consists of Nd, Er, Ho, or Tm, the second layer having a first end and a second end; and
a third layer, the third layer comprising the host material, the host material being undoped in the third layer, the second layer being between the first layer and the third layer, the third layer covering the first end and the second end of the second layer such that the second layer is completely embedded within the first layer and the third layer;
wherein the refractive index of the second layer is different than the refractive index of the first layer and the third layer, the monolithic single crystal waveguide having a length of about 2 centimeters or longer.

15. The monolithic single crystal waveguide of claim 14, wherein the refractive index of the second layer is larger than the refractive index of the first and the third layer.

16. The monolithic single crystal waveguide of claim 14, the second layer further comprising an Lu dopant and/or a Ga dopant.

17. The monolithic single crystal waveguide of claim 14, further comprising a fourth layer, the fourth layer comprising the host material and a lasing ion dopant, the third layer being between the second layer and the fourth layer.

18. The monolithic single crystal waveguide of claim 17, further comprising a fifth layer, the fifth layer comprising the host material, the host material being undoped in the fifth layer, the fourth layer being between the third layer and the fifth layer.

19. The monolithic single crystal waveguide of claim 14, further comprising a cladding layer that is external to the first layer and the third layer.

20. The monolithic single crystal waveguide of claim 19, wherein the cladding layer comprises an ion capable of absorbing a wavelength emitted by the lasing ion dopant.

21. The monolithic single crystal waveguide of claim 14, wherein the host material is a garnet, a vanadate, a rare earth sesquioxide, a spinel, or a borate.

22. A method for forming the monolithic single crystal waveguide of claim 14, the method comprising heating and pressurizing an aqueous solution held within a reactor to develop a temperature differential between a first zone of the reactor and a second zone of the reactor, the reactor containing a feedstock in the first zone and a seed crystal in the second zone, the seed crystal including the host material, the feedstock including a source for forming the host material and a source for the lasing ion dopant, wherein upon said heating and pressurizing growth of the second layer is initiated on the seed crystal to form an intermediate crystal including the second layer and the seed crystal as the first layer; and
heating and pressurizing a second aqueous solution held within a second reactor to develop a temperature differential between a first zone of the second reactor and a second zone of the second reactor, the second reactor containing a second feedstock in the first zone and the intermediate crystal in the second zone, the feedstock including a source for forming the host material, wherein upon said heating and pressurizing growth of the third layer is initiated on the intermediate crystal, the monolithic single crystal waveguide including the first, second and third layers.

23. The method of claim 22, the method further comprising removing a portion of the second layer from the first layer.

24. The method of claim 23, wherein the second layer has length between a first end and a second end and a first portion of the second layer is removed at the first end and a second portion of the second layer is removed at the second end.

25. The method of claim 24, wherein about 5% of the length of the second layer is removed after which the third layer is grown.

26. The method of claim 22, further comprising forming one or more additional layers on the first layer and/or on the third layer.

* * * * *

UNITED STATES PATENT AND TRADEMARK OFFICE
CERTIFICATE OF CORRECTION

PATENT NO. : 9,711,928 B2
APPLICATION NO. : 13/923942
DATED : July 18, 2017
INVENTOR(S) : Joseph Kolis and Colin McMillen It is certified that error appears in the above-identified patent and that said Letters Patent is hereby corrected as shown below:

In the Specification

Column 1, Line 18: Delete "Grant No. 0907395" and insert --Grant No. DMR 0907395--

Signed and Sealed this
Twenty-ninth Day of January, 2019

Andrei Iancu
*Director of the United States Patent and Trademark Office*